(12) United States Patent
Sinha et al.

(10) Patent No.: US 7,943,846 B2
(45) Date of Patent: May 17, 2011

(54) GROUP IV NANOPARTICLES IN AN OXIDE MATRIX AND DEVICES MADE THEREFROM

(75) Inventors: Sanjai Sinha, Pleasanton, CA (US); Elena Rogojina, Los Altos, CA (US)

(73) Assignee: Innovalight, Inc., Santa Clara, CA (US)

( * ) Notice: Subject to any disclaimer, the term of this patent is extended or adjusted under 35 U.S.C. 154(b) by 977 days.

(21) Appl. No.: 11/738,221

(22) Filed: Apr. 20, 2007

(65) Prior Publication Data

US 2008/0017242 A1   Jan. 24, 2008

Related U.S. Application Data

(60) Provisional application No. 60/794,045, filed on Apr. 21, 2006.

(51) Int. Cl.
*H01L 31/00* (2006.01)
*B32B 5/16* (2006.01)

(52) U.S. Cl. ............. 136/252; 136/243; 252/501.1; 257/E29.071; 257/E29.082

(58) Field of Classification Search .................. None
See application file for complete search history.

(56) References Cited

U.S. PATENT DOCUMENTS

| | | | |
|---|---|---|---|
| 5,720,827 A | 2/1998 | Simmons | |
| 6,126,740 A | 10/2000 | Schulz et al. | |
| 6,239,355 B1 | 5/2001 | Salafsky | |
| 6,268,014 B1 | 7/2001 | Eberspacher et al. | |
| 6,277,766 B1 | 8/2001 | Ayers | |
| 6,358,613 B1 | 3/2002 | Buriak | |
| 6,485,986 B1 | 11/2002 | Buriak et al. | |
| 6,548,168 B1 * | 4/2003 | Mulvaney et al. | 428/402 |
| 6,569,979 B1 | 5/2003 | Strother et al. | |
| 6,677,163 B1 | 1/2004 | Boukherroub et al. | |
| 6,710,366 B1 | 3/2004 | Lee et al. | |
| 6,846,681 B2 | 1/2005 | Buriak et al. | |
| 6,852,920 B2 * | 2/2005 | Sager et al. | 136/263 |
| 6,869,864 B2 | 3/2005 | Yim et al. | |
| 6,878,871 B2 | 4/2005 | Scher et al. | |
| 6,897,471 B1 | 5/2005 | Soref et al. | |
| 6,943,054 B2 | 9/2005 | Bocian et al. | |
| 6,986,818 B2 | 1/2006 | Tillotson et al. | |
| 2004/0095658 A1 | 5/2004 | Buretea et al. | |
| 2004/0229447 A1 * | 11/2004 | Swihart et al. | 438/507 |
| 2004/0266148 A1 | 12/2004 | Yim et al. | |
| 2005/0008880 A1 | 1/2005 | Kunze et al. | |
| 2005/0078158 A1 | 4/2005 | Magdassi et al. | |
| 2005/0095422 A1 * | 5/2005 | Sager et al. | 428/336 |
| 2005/0107478 A1 | 5/2005 | Klimov et al. | |
| 2005/0126628 A1 | 6/2005 | Scher et al. | |
| 2005/0150541 A1 | 7/2005 | Scher et al. | |
| 2005/0183766 A1 | 8/2005 | Nakajima et al. | |
| 2005/0214967 A1 | 9/2005 | Scher et al. | |
| 2006/0060862 A1 | 3/2006 | Bawendi et al. | |
| 2006/0094189 A1 | 5/2006 | Zurcher et al. | |
| 2006/0108688 A1 | 5/2006 | Richardson et al. | |
| 2007/0006914 A1 | 1/2007 | Lee | |
| 2008/0160265 A1 | 7/2008 | Hieslmair et al. | |
| 2008/0160733 A1 | 7/2008 | Hieslmair et al. | |

FOREIGN PATENT DOCUMENTS

| | | | |
|---|---|---|---|
| DE | 103 26 538 A1 | 1/2005 | |
| EP | 0654831 | 5/1995 | |
| JP | 2004-071716 | 3/2004 | |
| JP | 2005-217046 | 8/2005 | |
| JP | 2005-332913 | 12/2005 | |
| KR | 2005039294 | * | 5/2005 |
| WO | WO 99/21934 | * | 5/1999 |
| WO | WO 01/37324 | 5/2001 | |
| WO | WO 02/084708 | 10/2002 | |
| WO | WO 2004/023527 | 3/2004 | |
| WO | WO 2004/068536 | 8/2004 | |
| WO | WO 2004/093202 | 10/2004 | |
| WO | WO 2005/075048 | 8/2005 | |
| WO | WO 2006/034025 | 3/2006 | |
| WO | WO 2006/063893 | 6/2006 | |
| WO | WO 2006/076610 | 7/2006 | |

OTHER PUBLICATIONS

International Search Report for PCT/US2007/073037, mailed Nov. 15, 2007.

Dang, Y. X. et al., "Study of Interdiffusion Effect on the Band Structures of $Si_{1-x}Ge_x$/Si Quantum Wells," *Journal of Applied Physics*, vol. 99, No. 7, Apr. 10, 2006, pp. 076108-1-076108-3; published by American Institute of Physics.

Lenhart, J. L. et al., "Characterization of sizing layers and buried polymer/sizing/substrate interfacial regions using a localized fluorescent probe," *Journal of Colloid and Interface Science*, vol. 257 (2003), pp. 398-407; published by Elsevier Science (USA).

Li-Wei Tu et al., "Observation of quantum size effect in the resistivity of thin, gray tin epilayers", *Appl. Phys. Lett.*, vol. 55, No. 13, Sep. 25, 1989, pp. 1327-1329; published by American Institute of Physics.

Miesner, C. et al., "Intra-Valence Band Photocurrent Measurements on Ge Quantum Dots in Si," *Thin Solid Films*, vol. 380, No. 1-2, Dec. 22, 2000, pp. 180-182; published by Elsevier Science B.V.

Sarney, W. L. et al., "Microstructural Characterization of Quantum Dots with Type-II Band Alignments," *Solid-State Electronics*, vol. 50, No. 6, Jun. 2006, pp. 1124-1127; published by Elsevier Ltd.

"DuPont Photovoltaic Solutions," *Product Information Sheet K-15733*, pp. 1-2, Aug. 2006.

Preston et al., "Solar Energy Research at the Department of Energy. Big Deal!," Oct. 19, 2005.

(Continued)

*Primary Examiner* — Kamal A Saeed
(74) *Attorney, Agent, or Firm* — Foley & Lardner LLP

(57) ABSTRACT

Photoactive materials made from Group IV semiconductor nanoparticles dispersed in an inorganic oxide matrix and methods for making the photoactive materials are provided. In some instances, the nanoparticles are functionalized with organosilanes to provide nanoparticle-organosilane compounds. The photoactive materials may be formed by subjecting the nanoparticles or nanoparticle compounds to a sol-gel process. The photoactive materials are well-suited for use in devices which convert electromagnetic radiation into electrical energy, including photovoltaic devices, photoconductors, and photodetectors.

10 Claims, No Drawings

OTHER PUBLICATIONS

Dexheimer, S. L. et al., "Novel Characterization Methods for Microcrystalline Silicon," Subcontractor Report, National Renewable Energy Laboratory, NREL/SR-520-34949, Oct. 2003.

Sawires, L., "A new advanced microwave technology promises to increase the speed and energy efficiency of annealing, coating and joining everything from glass and ceramics to semiconductors," Nov. 1, 2002, available at http://www.ceramicindustry.com/, last visited Jun. 3, 2008.

Schropp, R. E. I., "Thin Film Silicon PV: Research and Implementation (PowerPoint)," *Zonneceldag 2003*, Utrecht University, Debye Institute, Physics of Devices, Sep. 30, 2003.

Nozik, A. J., "Advanced Concepts for Photovoltaic Cells," Presented at the National Center for Photovoltaics and Solar Program Review Meeting: Denver, Colorado, Mar. 24-26, 2003, pp. 1-5.

Ellingson et al. "Highly Efficient Multiple Exciton Generation in Colloidal PbSe and PbS Quantum Dots," *Nano Letters*, vol. 5, No. 5, (2005) pp. 865-871; published by American Chemical Society.

Ellingson et al. "Nanocrystals Generating >1 Electron Per Photon May Lead to Increased Solar Cell Efficiency," Printed from website on Sep. 11, 2006: http://newsroom.spie.org/x3923.xml?ss=print.

Shang Yuan Ren, "Quantum Confinement in Semiconductor Ge Quantum Dots," *Solid State Communications*, vol. 102, No. 6 (1997) pp. 479-484; published by Elsevier Science Ltd.

Wenju Feng et al., "Self-Assembly and Characterization of Fullerene Monolayers on Si(100) Surfaces," *Langmuir American Chem. Soc. USA*, vol. 15, No. 9 (Apr. 27, 1999), pp. 3152-3156; published by American Chemical Society.

International Search Report for PCT/US2007/077007, mailed Mar. 17, 2008.

Chekalin, S. et al., "Ultrafast photoinduced processes in fullerene-metal nanostructures," *Proc. Spie. Int. Eng; Proceedings of Spie—The International Society for Optical Engineering; Photon Echo and Coherent Spectroscopy*, vol. 6181 (2005), Sep. 18, 2005, pp. 1-5.

Database WPI Week 200564, Derwent Publications Ltd., London, GB, reporting Abstract of JP2005-236278.

International Search Report for PCT/US2007/079393, mailed Sep. 25, 2008.

International Search Report for PCT/US2007/084655, mailed Oct. 8, 2008.

Mayo, M. J. et al., "Porosity-Grain Growth Relationships in the Sintering of Nanocrystalline Ceramics," *Nanostructured Materials*, vol. 3, pp. 43-52, 1993; published by Pergamon Press Ltd.

Garcia-Serrano, J. et al., "Formation and vibrational structure of Si nano-clusters in ZnO matrix," *Revista Mexicana De Fisica*, 47(1), Feb. 2001, pp. 26-29.

Ray, S. K. et al., "Luminescence characteristics of Ge nanocrystals embedded in $SiO_2$ matrix," *Optical Materials*, 27, Feb. 2005, pp. 948-952; published by Elsevier B.V.

Ando, M. et al., "Transient photocurrent of (silicon nanocrystals)-(organic polysilane) composites—detection of surface states of silicon nanocrystals," *Thin Solid Films* 499 (1-2), Mar. 2006, pp. 119-122; published by Elsevier B.V.

Martucci, A. et al., "Microstructural and nonlinear optical properties of silica-titania sol-gel film doped with PbS quantum dots," *J. Applied Physics*, 86 (1), Jul. 1999, pp. 79-87; published by American Institute of Physics.

Guglielmi, M. et al., "Control of Semiconductor Particle Size in Sol-Gel Thin Films," *Journal of Sol-Gel Sciences and Technology*, 8, 1997, pp. 1017-1021; published by Kluwer Academic Publishers, The Netherlands.

Buriak, J. M., "Organometallic chemistry on Silicon and Germanium Surfaces," *Chemical Reviews*, 102 (5) (May 2002), pp. 1271-1308; published by American Chemical Soceity.

Lau, H. W. et al., "Defect-induced photoluminescence from tetraethylorthosilicate thin films containing mechanically milled silicon nanocrystals," *J. Applied Physics*, 97 (10) (May 2005), pp. 104307-1-104307-4; published by American Institute of Physics.

Dias, M. L. et al., "Core shell silica-silicon hybrid nanoparticles: synthesis and characterization," *J. Metastable and Nanocrystalline Materials*, 22 (2004), pp. 83-90; published by Trans Tech Publications, Switzerland.

International Search Report and Written Opinion from PCT/US2007/067126, mailed May 12, 2007.

\* cited by examiner

GROUP IV NANOPARTICLES IN AN OXIDE MATRIX AND DEVICES MADE THEREFROM

CROSS-REFERENCE TO RELATED APPLICATIONS

This application claims the benefit of U.S. Provisional Patent Application Ser. No. 60/794,045 filed Apr. 21, 2006, the disclosure of which is incorporated by reference in its entirety.

FIELD OF THE INVENTION

This invention generally relates to photoactive materials made from Group IV semiconductor nanoparticles dispersed in an inorganic oxide matrix, to methods for making the photoactive materials and to devices incorporating the photoactive materials.

BACKGROUND

Quantum dots are nanometric scale particles, or "nanoparticles" that show quantum confinement effects. In the case of semiconductor nanoparticles having spatial dimensions less than the exciton Bohr radium, the quantum confinement effect manifests itself in the form of size-dependent tunable band gaps and, consequently, tunable light absorption and emission properties.

To exploit the tunable properties, semiconductor quantum dots are incorporated into devices, such as photovoltaic cells and light emitting diodes, typically in the form of films having suitable electronic and optical coupling with the device and the outside world. Semiconductor quantum dots have been incorporated into inorganic films for use in a variety of devices. For example, published U.S. Patent Application US 2005/010747 describes nanocrystal-polymer complexes dispersed in a titania matrix for use in photoluminescent devices. Unfortunately, the large size of the amphiphilic polymers of the complex make it difficult to achieve high nanoparticle loadings in the matrix. In addition, the amphiphilic polymer and/or any capping ligands on the nanoparticles within the matrix may act as an insulating layer, rendering the material unsuitable for applications where such an insulating layer would be undesirable. Organo-Silane-capped Group II-IV quantum dots in a silicate film for use in light emitting devices are described in U.S. Pat. No. 6,869,864. In addition, CdS and PbS quantum dots have been incorporated into silica-titania films. See, for example, Martucci, et al., J. Appl. Phys., 86, 79 (1999). However, none of the above-cited references teach films containing Group IV semiconductor nanoparticles in an oxide matrix that are suitable for use in photoactive devices, such as photovoltaic devices. Nor do the references teach methods suitable for forming such films.

SUMMARY

The present invention provides organosilane-capped Group IV semiconductor nanoparticles, films of Group IV semiconductor nanoparticles in an oxide matrix and methods for making the films using a sol-gel process.

One aspect of the invention provides a nanoparticle-organosilane compound comprising a Group IV nanoparticle having a surface functionalized with organosilane molecules. The compound may be the product of reactions between terminal alkynyl groups of alkynyl silanes and the Group IV nanoparticle, or reactions between terminal alkenyl groups of alkenyl silanes and the Group IV nanoparticle. A plurality of such nanoparticle-organosilane compounds may be dispersed in an oxide matrix to provide a photoactive or luminescent material. The oxide matrix may be formed by a sol-gel process. The material may be incorporated into a photoactive device, such as a photovoltaic cell, or a light emitting device, such as a light emitting diode.

Another aspect of the invention provides a photoactive or luminescent material comprising a plurality of Group IV nanoparticles dispersed in a crystalline oxide matrix, which may be formed by a sol-gel process. This material may also be incorporated into a photoactive device, such as a photovoltaic cell, or a light emitting device, such as a light emitting diode.

In general, the devices provided by the present invention include a first electrode, a second electrode and the photoactive or luminescent material in electrical communication with the first and second electrodes.

Methods for making photoactive or luminescent materials are also provided. One method includes the steps of: reacting Group IV semiconductor nanoparticles with an alkynyl silane or an alkenyl silane to form nanoparticle-organosilane compounds; mixing the nanoparticle-organosilane compounds with an oxide matrix precursor; and subjecting the mixture to a sol-gel process to form an oxide matrix having a plurality of Group IV semiconductor nanoparticles dispersed therein.

Further objects, features and advantages of the invention will be apparent from the following detailed description when taken in conjunction with the accompanying drawings.

DETAILED DESCRIPTION

Photoactive materials made from Group IV semiconductor nanoparticles dispersed in an inorganic oxide matrix and methods for making the photoactive materials are provided. In some instances, the nanoparticles are functionalized with organosilanes to provide nanoparticle-organosilane compounds. The photoactive materials may be formed by subjecting the nanoparticles or nanoparticle compounds to a sol-gel process. The photoactive materials are well-suited for use in devices which convert electromagnetic radiation into electrical energy, including photovoltaic devices, photoconductors and photodetectors. The materials may also be used in light emitting devices, such as light emitting diodes.

Group IV Semiconductor Nanoparticles

The Group IV semiconductor nanoparticles are nanoparticles that include a Group IV semiconductor. As used herein, the term nanoparticle generally refers to particles that have an average diameter of about 100 nm, or less. This includes particles having an average diameter of about 50 nm or less. For example, the population of nanoparticles in a photoactive material may have an average diameter of about 3 to about 20 nm. The nanoparticles may exhibit a number of unique electronic, magnetic, catalytic, physical, optoelectronic and optical properties due to quantum confinement effects. These quantum confinement effects may vary as the size of the nanoparticle is varied. The nanoparticles may have a variety of shapes and a given population of nanoparticles may include nanoparticles of different shapes. Thus, the nanoparticles may be generally spherical, cubic, and/or pyramidal in shape, or they may have more complex shapes, such as double square pyramidal and cube octahedral. In some instances nanoparticles, such as nanowires or nanorods, may have elongated particle shapes.

Group IV nanoparticles include, but are not limited to, Si nanoparticles, Ge nanoparticles, Sn nanoparticles, SiGe alloy nanoparticles and alloys of tin and Si and/or Ge. The nanoparticles may include a core and an inorganic shell. Such nanoparticles shall be referred to as "core-shell nanoparticles". The core-shell nanoparticles of the present invention include a Group IV semiconductor in their shell or in both their core and their shell. For example, the core-shell nanoparticles may include a Si core and a Ge shell, or a Ge shell and an Si core.

In some embodiments, the Group IV nanoparticles (including the core-shell nanoparticles) may be capped by organic molecules, such as organosilanes, which are bound to the surface of the nanoparticles. These organic molecules may facilitate the incorporation of the nanoparticles into the inorganic oxide matrix via a sol-gel process. Examples of suitable organosilanes include, but are not limited to bi-functional organosilanes having terminal alkenyl or alkynyl groups that react with the nanoparticles to form the nanoparticle-organosilane compounds.

The Oxide Matrix

The Group IV nanoparticles may be embedded in an electrically conducting, transparent, inorganic oxide matrix that is formed by a sol-gel process. The matrix may include various inorganic oxides, but preferably includes a wide bandgap oxide semiconductor. Examples of suitable transition metal oxide matrices include, but are not limited to, titanium oxides, zinc oxides, niobium oxides, tantalum oxides, tungsten oxides, molybdenum oxides, and mixtures thereof. In some embodiments, the oxide matrix is not a silicate matrix. Depending upon the temperatures used on the sol-gel process, the oxide matrix may be an amorphous matrix or a crystalline matrix.

A description of sol-gel processes may be found in Brinker et al., "Sol-Gel Science, The Physics and Chemistry of Sol-Gel Processing," Academic Press, 1990. Suitable metal oxide matrix precursors that may be used to form an oxide matrix via a sol-gel processes are known and commercially available. These include, but are not limited to, metal alkoxides.

The Photoactive Material

Within the photoactive material, the nanoparticles are spaced apart in the oxide matrix by distances that depend on the concentration of nanoparticles in the material. Generally, the photoactive material has a Group IV nanoparticle content that is sufficiently high to allow the material to conduct the carriers generated when the material is exposed to light. The desired nanoparticle loading will depend on the sensitivity and/or efficiency requirements for the particular application and on the composition of the nanoparticles in the photoactive material. For example, nanoparticles made from lower bandgap semiconductors, such as Ge, typically require lower nanoparticle loadings. In some embodiments a volume loading of nanoparticles of at least about 1% may be sufficient. However, for some applications, higher nanoparticle loadings may be desirable (e.g., about 1 to about 50%). Thus, in some embodiments the photoactive material may have a nanoparticle loading of at least about 10% by volume (e.g., about 35 to about 50%). This includes embodiment where the photoactive material has a nanoparticle loading of at least about 20%, at least about 30%, at least about 35%, at least about 40%, at least about 45% and at least about 50% by volume.

The Group IV nanoparticles in the oxide matrix may have a polydisperse or a substantially monodisperse size distribution. In applications where high nanoparticle loading is desirable, it may be advantageous to use nanoparticles with a polydisperse size distribution, which allows for denser packing of the nanoparticles in the oxide matrix. As used herein, the term "substantially monodisperse" refers to a plurality of nanoparticles which deviate by less than 20% root-mean-square (rms) in diameter, more preferably less than 10% ns, and most preferably less than 5% rms, where the diameter of a nanoparticle refers to the largest cross-sectional diameter of the nanoparticle. The term polydisperse refers to a plurality of nanoparticles having a size distribution that is broader than monodisperse. For example, a plurality of nanoparticles which deviate by at least 25%, 30%, or 35%, root-mean-square (rms) in diameter would be a polydisperse collection of nanoparticles. One advantage of using a population of Group IV nanoparticles having a polydisperse size distribution is that different nanoparticles in the population will be capable of absorbing light of different wavelengths. This may be particularly desirable in applications, such as photovoltaic cells, wherein absorption efficiency is important.

Applications

The photoactive materials may be used in a variety of devices which convert electromagnetic radiation into an electric signal. Such devices include photovoltaic cells, photoconverters, photoemitters and photodetectors. Generally, these devices will include the photoactive material electrically coupled to two or more electrodes. When the photoactive material is used in a photovoltaic cell, the device may further include a power consuming device (e.g., a light, a computer, etc.) which is in electrical communication with, and powered by, one or more photovoltaic cells. When the photoactive material is used in a photoconductor or photodetector, the device further includes a current detector coupled to the photoactive material. The photoactive materials may also be used in light emitting devices, such as light emitting diodes.

Methods of Making Photoactive Materials

The photoactive materials may be formed from Group IV nanoparticles that have been functionalized (or "capped") with organic molecules. In one such embodiment Group IV nanoparticles having hydrogen-terminated surfaces are functionalized with an organic molecule which includes a functional group capable of reacting with an oxide matrix precursor in a sol-gel process. When the capped nanoparticles and the oxide matrix precursors are reacted in a sol-gel process, the resulting oxide matrix, at least initially, has nanoparticles covalently bound therein. Organosilane molecules which possess hydroxyl groups capable of reacting with an oxide matrix precursor are well-suited for use as capping agents for the Group IV nanoparticles. Such molecules may be formed by subjecting suitable organosilanes to hydrolysis to generate hydroxyl functionalities. Specific examples of suitable organosilanes include, but are not limited to, alkenyl silanes and alkynyl silanes. Organosilanes that may undergo hydrolysis to form hydroxyl-functionalized organosilanes include molecules having the following formulas:

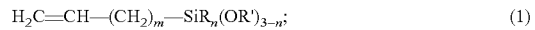

$$H_2C=CH-(CH_2)_m-SiR_n(OR')_{3-n}; \qquad (1)$$

and

$$HC\equiv C-(CH_2)_m-SiR_n(OR')_{3-n} \qquad (2)$$

molecules, wherein $m \geq 2$, $n=1$ and R and R' are either $C_kH_{k+1}$, where $k \geq 1$, or

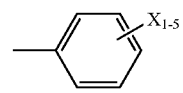

wherein X is an atom or group that is unreactive toward the nanoparticles. Thus, X is not an amine group, a carboxylic acid group, a nitrile group, an aldehyde group, a ketone group or a hydroxyl group. In some embodiments X is an organic group, such as a substituted or unsubstituted alkyl group, cycloalkyl group, or an aryl group. However, X is not limited to groups that fall into these categories. The alkenyl or alkynyl groups on these capping agents react with the hydrogen-terminated nanoparticles to provide organosilane-capped nanoparticles. The organosilane molecules may then be hydrolyzed to provide reactive —OH groups on the organosilane molecules. Alternatively, the organosilane-capped nanoparticles may be mixed with an oxide matrix precursor and a solvent and then hydrolyzed and subjected to a sol-gel process to form an oxide matrix with nanoparticles dispersed therein. More detailed examples of this method are provided in Examples 1-3, below.

Alternatively, the nanoparticles need not be capped prior to incorporation into an oxide matrix. In one such embodiment, uncapped Group IV nanoparticles may be exposed to air, mixed with an oxide matrix precursor and a solvent and subjected to a sol-gel process to form an oxide matrix with nanoparticles dispersed therein. In another embodiment, which is suitable for use with Si nanoparticles, hydrogen-terminated Si nanoparticles may be oxidized with piranha solution (or equivalent solution) to form hydroxyl-terminated nanoparticles which may be mixed with an oxide matrix precursor and solvent and subjected to a sol-gel process to form an oxide matrix with Si nanoparticles dispersed therein. More detailed examples of this method are provided in Examples 4 and 5, below.

In the methods described above, the Group IV nanoparticles may be chemically bound to the oxide matrix. However, the photoactive materials may be formed with the nanoparticles trapped within (but not covalently bound to) pores in the oxide matrix. This may be accomplished by functionalizing the nanoparticles with groups that are non-reactive toward the oxide matrix precursor used to form the oxide matrix in a sol-gel process. Non-functionalized alkyl chains and hydrogen atoms are examples of non-reactive groups that may be used to functionalize the surface of the nanoparticles.

For producing films of photoactive materials, a mixture of the nanoparticles, oxide matrix precursor, solvent and an acid or base catalyst is coated onto a substrate. The mixtures may be applied to a substrate as thin films using any suitable application techniques. Suitable techniques include, but are not limited to, spin-coating, dip-coating, spraying, printing (e.g., inkjet printing) and roll coating. Alternatively, the mixtures may be cast in a mold. The coating is then heat treated to produce the photoactive material.

The structure of the photoactive material will depend on the heat treatment conditions used in the sol-gel process. At sufficiently high temperatures (e.g., temperatures above the glass transition temperature of the oxide matrix), the organosilane capping molecules may burn off and the oxide matrix will crystallize. For example, a titanium dioxide matrix will form anatase after annealing at high temperatures (e.g., $\geq 400°$ C.). The organosilane capping molecules tend to provide an electrically insulating layer around the nanoparticles. Therefore, the elimination of the organosilane capping molecules from the oxide matrix may be advantageous in applications, such as in photoconductors and photovoltaics, where an insulating layer is undesirable. However, in applications where an insulating layer is desirable, such as in photoemitters, the heat treatment may be carried out at temperatures below which the organosilanes are burned off and the matrix crystallizes.

Multiple films of the photoactive material may be applied over a substrate to form a photoactive material having the desired thickness. In some embodiments the compositions and/or size distributions of the nanoparticles in the various film layers may be different, such that different layers have different light absorbing characteristics. For example, the layers may be arranged with an ordered distribution, such that the nanoparticles having the highest bandgaps are near one surface of a multilayered photoactive material and the nanoparticles having the lowest bandgaps are near the opposing surface of a multilayered photoactive material.

EXAMPLES

Example 1

Organosilane-Capped Silicon Nanoparticle (Si—NP-BTES) Formation

Si nanoparticles were produced using a plasma-based approach. This approach is described in detail in U.S. Patent Application Publication No. 2006/0051505, the entire disclosure of which is incorporated herein by reference. In a nitrogen glove box, the Si nanoparticles were loaded into an air-free flask and 3-butenyl-triethoxysilane (BTES) was added to the flask. The resulting reaction mixture was boiled for a week. After removing the unreacted capping agent, the material was re-solvated, filtered and the solvent was evaporated. The resulting brown powder was used for film preparation (see Example 2, below).

Example 2

Organosilane-Capped Silicon Nanoparticle/$TiO_2$ Matrix Formation

Initiation of the Sol-Gel Process

A quantity of 0.025 grams of the capped silicon nanoparticles (Si—NP-BTES) was mixed with 5 ml of high purity ethanol. The resulting mixture was sonicated for 1 hour. A drop of mono-ethanol amine sol-gel catalyst was added to the mixture and the sonication continued for an additional hour.

In parallel, 0.2276 grams of the oxide matrix precursor, solid titanium ethoxide (mp 40° C.), was mixed with 5 ml of high purity ethanol and a drop of mono-ethanol amine. The resulting mixture was stirred on a hot plate at 50° C. for approximately 2 hours.

The two mixtures so obtained were mixed together and stirred at room temperature for approximately 3 hours. A medium brown opaque liquid was obtained.

Film Preparation

The medium brown opaque liquid was spin cast on glass and indium tin oxide (ITO) coated glass. After spinning, the film-coated substrates were annealed at a temperature of at least 300° C., in air for 5 minutes. Optical absorption measurements were then taken. This process was repeated five times on the same substrates to increase the film thickness. Optical absorption measurements indicate enhanced absorption in the visible region of the solar spectrum as the film thickness is progressively increased. This enhanced absorption in the visible region is due to the successful entrainment of the Si nanoparticles in an anatase $TiO_2$ matrix. Pure $TiO_2$ films are transparent in this region of the solar spectrum.

Example 3

Organosilane-Capped Silicon Nanoparticle/ZnO Matrix Formation

Initiation of the Sol-Gel Process

A quantity of 0.0025 grams of capped silicon nanoparticles (Si—NP-BTES) was mixed with 2.5 of methoxy-ethanol and sonicated for 1 hour. Five drops of mono-ethanol amine (MEA) was then added to the mixture and this mixture was stirred for approximately 12 h. The resulting fine dispersion was mixed with 0.439 g zinc acetate dehydrate, 10 ml of methoxy-ethanol, and 2 drops of MEA. The dispersion was then sonicated for 25 min. A light brown opaque liquid was obtained.

Film Preparation

Film preparation was carried out according to the procedure in Example 2, above.

Example 4

Hydroxyl-Functionalized Silicon Nanoparticle (Si—NP—OH) Formation

Silicon nanoparticles were made using the plasma method described in U.S. Patent Application Publication No. 2006/0051505. The nanoparticles were briefly washed with diluted 5% aqueous HF, filtered and then mixed with piranha solution ($H_2SO_4$ conc.:$H_2O_2$ (35%)=7:3). The resulting mixture was boiled for 30 min. The resulting light brown material was then filtered to remove the piranha solution, washed three times with deionized water and briefly dried over a filter to remove residual water.

Example 5

Hydroxyl-Functionalized Silicon Nanoparticle/ZnO Matrix Formation

Initiation of the Sol-Gel Process

Photoactive films containing different loadings of Si nanoparticles in a ZnO matrix were prepared. In the first film the weight ratio of Si nanoparticles to ZnO matrix was 10:1; in the second film the weight ratio was 2:1.

To make the 10:1 film, 10 mg of the light brown powder (Si—NP—OH) from Example 4 was mixed with 2.63 g of Zn acetate di-hydrate, 9 ml of methoxy-ethanol and 2 drops of MEA. The resulting mixture was stirred for approximately 12 hours.

To make the 2:1 film, 10 mg of the light brown powder (Si—NP—OH) from Example 4 was mixed with 1.05 g of Zn acetate di-hydrate, 3 ml of methoxy-ethanol and 1 drop of MEA. The resulting mixture was stirred for approximately 12 hours.

Film Preparation

The light brown liquids resulting from both of the above-cited mixtures were spin-coated on glass substrates. The resulting films were annealed at 600° C. in air for 5 min. The film obtained from the 10:1 (Si nanoparticle:ZnO) liquid had an opaque lightly brown color. The film obtained from the 2:1 (Si nanoparticle:ZnO) liquid showed visible phase segregation with islands of material divided by cracks. Both films were characterized with optical absorbance measurements. The measurements indicate enhanced absorbance in the visible region of the solar spectrum as the amount of silicon nanoparticles in the film increases. This is due to the successful incorporation of silicon nanoparticles into a crystalline ZnO matrix. Pure ZnO films are transparent in this region of the solar spectrum.

For the purposes of this disclosure and unless otherwise specified, "a" or "an" means "one or more", All patents, applications, references and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While the principles of this invention have been described in connection with specific embodiments, it should be understood clearly that these descriptions are made only by way of example and are not intended to limit the scope of the invention.

What is claimed is:

1. A nanoparticle-organosilane compound comprising a Group IV nanoparticle having a surface functionalized with organosilane molecules, wherein the nanoparticle-organosilane compound has the structure (NP)—$(CH_2)_m$—$SiR_n(OH)_{3-n}$, or (NP)—$(CH_2)$=CH—$(CH_2)_p$—$SiR_n(OH)_{3-n}$, wherein (NP) represents the nanoparticle, m≧2, R is an organic aliphatic or aromatic group that is unreactive toward the nanoparticles, n is ≧0, and p≧1.

2. The compound of claim 1, wherein the compound is the product of reactions between terminal alkynyl groups of alkynyl silanes and the Group IV nanoparticle, or reactions between terminal alkenyl groups of alkenyl silanes and the Group IV nanoparticle.

3. The compound of claim 2, wherein the organosilane molecules are selected from the group consisting of: $H_2C$=CH—$(CH_2)_m$—$SiR_n(OR')_{3-n}$; and HC≡C—$(CH_2)_m$—$SiR_n(OR')_{3-n}$ molecules, wherein m≧1, R and R' are organic aliphatic or aromatic groups that are unreactive toward the nanoparticles, OR' is a functional group capable of undergoing hydrolysis, and n is ≦2.

4. The compound of claim 3, wherein m≧2, n=1 and R and R' are either $C_kH_{k+1}$, where k≧1, or

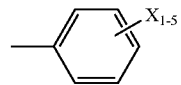

wherein X is an atom or functional group that is unreactive toward the nanoparticle.

5. The compound of claim 1, wherein n=0.

6. A photoactive material comprising a plurality of the nanoparticle-organosilane compounds of claim 1 in an oxide matrix.

7. The photoactive material of claim 6, wherein the oxide matrix comprises an oxide selected from the group consisting of titanium oxides, zinc oxides, niobium oxides, tantalum oxides, tungsten oxides, molybdenum oxides, and mixtures thereof.

8. The photoactive material of claim 6, wherein the oxide matrix is formed by a sol-gel process.

9. A photoactive device comprising a first electrode, a second electrode, and the photoactive material of any of claim 6, wherein the photoactive material is in electrical communication with the first and second electrodes.

10. The photoactive device of claim 9, wherein the photoactive device is a photovoltaic cell.

* * * * *